US009225356B2

(12) United States Patent
Mu et al.

(10) Patent No.: US 9,225,356 B2
(45) Date of Patent: *Dec. 29, 2015

(54) PROGRAMMING A NON-VOLATILE MEMORY (NVM) SYSTEM HAVING ERROR CORRECTION CODE (ECC)

(71) Applicant: FREESCALE SEMICONDUCTOR, INC., Austin, TX (US)

(72) Inventors: Fuchen Mu, Austin, TX (US); Chen He, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 227 days.

This patent is subject to a terminal disclaimer.

(21) Appl. No.: 13/674,367

(22) Filed: Nov. 12, 2012

(65) Prior Publication Data

US 2014/0136928 A1    May 15, 2014

(51) Int. Cl.
| | |
|---|---|
| G11C 29/00 | (2006.01) |
| H03M 13/05 | (2006.01) |
| G11C 29/50 | (2006.01) |
| G11C 29/52 | (2006.01) |
| G11C 13/00 | (2006.01) |
| G06F 11/10 | (2006.01) |
| G11C 29/04 | (2006.01) |

(52) U.S. Cl.
CPC ............ *H03M 13/05* (2013.01); *G06F 11/1068* (2013.01); *G11C 13/0002* (2013.01); *G11C 13/0064* (2013.01); *G11C 13/0069* (2013.01); *G11C 29/50008* (2013.01); *G11C 29/52* (2013.01); *G11C 2029/0409* (2013.01); *G11C 2029/0411* (2013.01)

(58) Field of Classification Search
CPC ............. H03M 13/6566; H03M 13/05; G11C 11/5628; G11C 16/3454; G11C 16/06; G01R 31/318328; G01R 31/318357; G01R 31/318583
USPC ............. 365/185.22, 185.19, 189.18, 230.08, 365/185.03; 714/718, 763, 768, 764
See application file for complete search history.

(56) References Cited

U.S. PATENT DOCUMENTS

| | | | |
|---|---|---|---|
| 5,579,262 A | 11/1996 | Song | |
| 5,995,417 A | 11/1999 | Chen et al. | |
| 6,967,873 B2 | 11/2005 | Hamilton et al. | |
| 7,092,290 B2 | 8/2006 | Hemink | |
| 7,158,416 B2 | 1/2007 | Kern | |
| 7,177,199 B2 | 2/2007 | Chen et al. | |
| 7,400,537 B2 | 7/2008 | Hemink et al. | |
| 7,619,930 B2 | 11/2009 | Mokhlesi | |
| 7,778,084 B2* | 8/2010 | Kim et al. ................ | 365/185.22 |
| 7,808,829 B2 | 10/2010 | Lee | |
| 7,859,922 B2* | 12/2010 | Aritome ................... | 365/189.18 |
| 7,889,592 B2* | 2/2011 | Kim ........................ | 365/230.08 |
| 8,064,267 B2 | 11/2011 | Sarin et al. | |
| 8,077,513 B2* | 12/2011 | Ho et al. .................. | 365/185.03 |
| 8,391,080 B2 | 3/2013 | Sarin et al. | |

(Continued)

*Primary Examiner* — David Ton

(57) ABSTRACT

A method of programming a non-volatile semiconductor memory device includes determining a number of bit cells that failed to program verify during a program operation. The bit cells are included in a subset of bit cells in an array of bit cells. The method further determines whether an Error Correction Code (ECC) correction has been previously performed for the subset of bit cells. The program operation is considered successful if the number of bit cells that failed to program verify after a predetermined number of program pulses is below a threshold number and the ECC correction has not been performed for the subset of bit cells.

20 Claims, 2 Drawing Sheets

(56) References Cited

U.S. PATENT DOCUMENTS

| | | |
|---|---|---|
| 8,493,792 B2 * | 7/2013 | Aritome et al. .......... 365/185.19 |
| 8,713,406 B2 * | 4/2014 | Mu et al. ....................... 714/764 |
| 2006/0133141 A1 | 6/2006 | Gorobets |
| 2008/0089135 A1 | 4/2008 | Ito |
| 2008/0291739 A1 * | 11/2008 | Lee et al. ................. 365/185.22 |
| 2009/0168544 A1 | 7/2009 | Jeon |
| 2012/0140566 A1 * | 6/2012 | Aritome et al. .......... 365/185.19 |
| 2012/0201082 A1 | 8/2012 | Choy et al. |

* cited by examiner

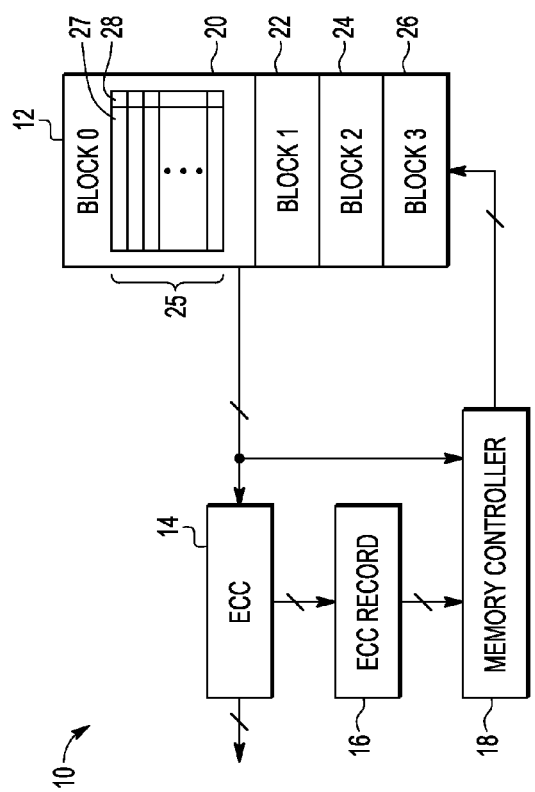
FIG. 1
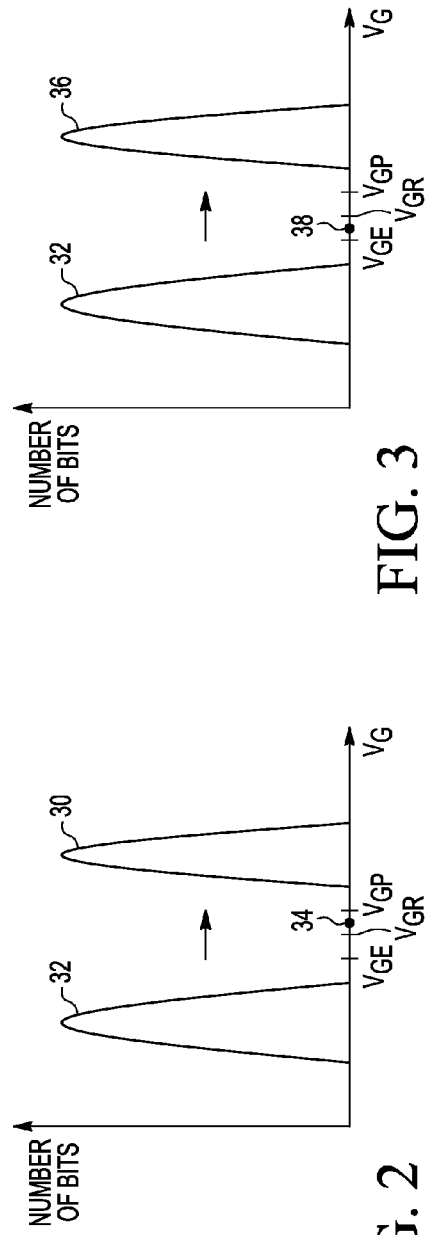
FIG. 2
FIG. 3

PROGRAMMING A NON-VOLATILE MEMORY (NVM) SYSTEM HAVING ERROR CORRECTION CODE (ECC)

RELATED APPLICATION

This application is related to AC50669TS

BACKGROUND

1. Field

This disclosure relates generally to non-volatile memories (NVMs), and more specifically, to NVM systems with error correction code (ECC).

2. Related Art

Non-volatile memories (NVMs) generally require special operations for program and erase and there is a limit to how many times these operations can be performed. Whereas in a common memory type, flash, the memory is erased in blocks, it is programmed in segments. Although more than one segment may be programmed at the same time, the portion being programmed is less than a whole block. Nonetheless, there can still be bits that required significantly more programming pulses than the vast majority of other bits. These bits that are slow to program may be referenced as a slow to program bit. Another issue is that over time and perhaps tens of thousands of cycles, some memory cells may become weak or slow to program. These latent weak memory cells are very difficult to detect until they actually become weak or slow to program. Thus, it is not uncommon for them to occur well after the device has been placed in a product which may cause product failure. Product failure is very desirable to avoid under any circumstances but especially failure of an integrated circuit. This is not generally something that the user of the product can repair, but the product must be returned and someone with special training and expensive equipment must do the repair assuming the repair is even worth doing in light of the cost of repair relative to the cost of the product.

Accordingly, there is a need for NVM systems to improve upon one or more of the issues raised above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 1 is an NVM system according to an embodiment;

FIG. 2 is a diagram helpful in understanding the NVM system of FIG. 1;

FIG. 3 is a diagram helpful in understanding the NVM system of FIG. 1; and

DETAILED DESCRIPTION

Figure 4:
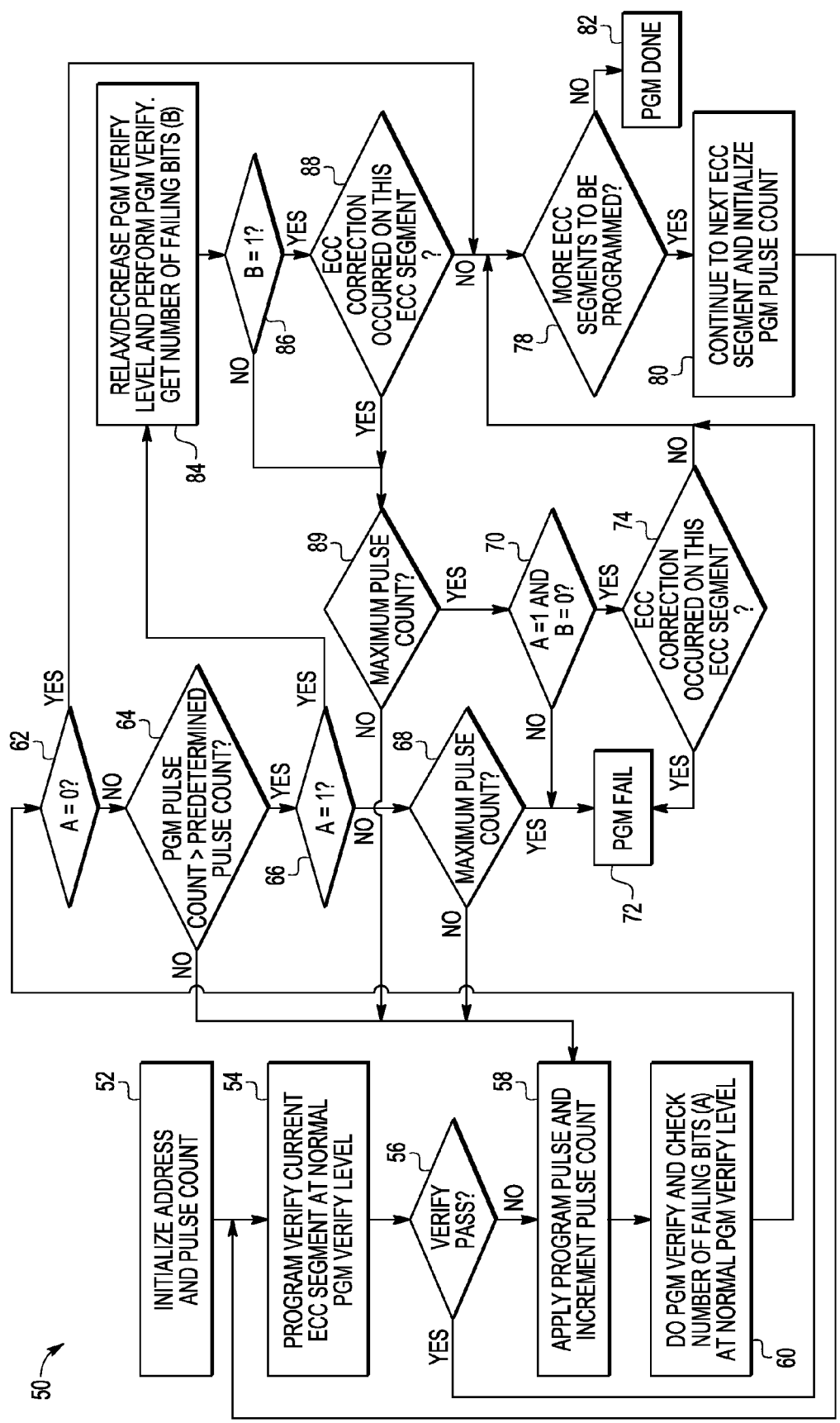
FIG. 4 is a flow chart helpful in understanding the NVM system of FIG. 1

In one aspect, error correction code (ECC) is used in conjunction with a non-volatile memory (NVM) to optimize the program operation. Especially after usage for quite some program/erase cycles, a program operation may be hindered by a single bit that is slow to program. When the single bit is significantly far from being programmed, it may be predictable that it is unlikely to ever be successfully programmed. In such case, ECC may be relied upon to correct this slow to program bit during the following read operations. On the other hand, if the single bit is relatively close to being successfully programmed, the program process can continue with a high degree of confidence that it will be successfully programmed. This is better understood by reference to the drawings and the following written description.

Shown in FIG. 1 is a non-volatile memory (NVM) system 10 having an NVM array 12, an error correction code (ECC) unit 14, an ECC record 16, and a memory controller 18. NVM array 12 includes a plurality of blocks including a block 20 that is shown as block 0, a block 22 that is shown block 1, a block 24 that is shown as block 2, and a block 26 that is shown as block 3. Memory controller 18 is coupled to NVM array 12 and ECC record 16. ECC unit 14 is coupled to NVM array 12 and ECC record 16. Blocks 20, 22, 24, and 26 each have a plurality of memory cells arranged in a plurality of ECC segments. Block 20 is an exemplary block having a plurality of ECC segments 25 each having data bits and ECC bits. Exemplary data bits 27 and exemplary ECC bits 28 form a single ECC segment. An ECC segment is the unit, or subset, of a block in which error correction or detection occurs for the data within the ECC segment. For example, a typical ECC approach is capable of correcting a single-bit error and detecting a double-bit error in an ECC segment. For a given block of blocks 20, 22, 24, and 26, all of the memory cells are erased at the same time but are programmed in ECC segments, which may be two segments at a time but less than the whole block. ECC bits 28 correspond to data bits 27 and store information relative to data bits 27 and in this way for set of data bits there is a corresponding set of ECC bits that store information relative to its corresponding data bits. It is typical of NVMs that are flash memories that the erase operation is by block but the program is by segments.

Memory controller 18 controls the operation of NVM array 12 such as controlling the block erase operations, reading, and segment programming. ECC unit 14 receives the output of NVM array 12, corrects errors, and provides a corrected output. ECC unit 14 also provides information to ECC record 16 as to which locations in NVM array needed correcting and information about those corrections. ECC record 16 is preferably stored in non-volatile memory and may be in a reserved portion of NVM array 12. Typically during programming operation, users only need to specify the data bits 27 to be programmed, and the corresponding ECC bits 28 will be calculated by the ECC unit and then programmed together with the data bits. Memory controller 18 has access to the information stored in ECC record 16.

Shown in FIG. 2 is a gate voltage distribution 32 of bits before a program operation of one of blocks 20, 22, 24, and 26 and a distribution 30 of bits after a portion of the program operation. Distribution 32 shows the initial state of the ECC segments to be programmed in which all of the bits of the segment are at an erases state. The distribution is desirably tight. The program operation is performed as pluralities of program pulses to raise a threshold voltage of the bits of the ECC segments of the block being programmed to a sufficiently high threshold voltage so that the gate voltage Vg at which they conduct a specified current is above the normal program verify level which is referenced as normal program verify Vgp. So a first step is applying a first group of consecutive program pulses to a portion of the block which may be two ECC segments. After the first step, the bit cells in the segments are tested to verify that they have been properly programmed by which the gate voltage Vg for conducting the specified current is above normal program verify Vgp. This testing of the bit cells may be referenced as a program verify. If more programming is required, subsequent steps of applying pulses are performed. The subsequent steps may have the same number of pulses for the same duration and at the same voltage. On the other hand, the subsequent program steps can be the same or different as to the number of pulses, the time duration, and the voltage. Distribution 30 is considered programmed because all of the bits in distribution 30 have a threshold voltage that results, with an applied gate voltage at normal program verify Vgp, in no more than a specified current being conducted. The bits of distribution 30 may thus be referenced as being above the normal program verify voltage Vgp. The gate voltage Vg that is applied to the bit cells during a normal read operation of NVM system 10 is between an erase verify voltage Vge and program verify voltage Vgp and is chosen based upon the optimum for performing a read that distinguishes between the programmed and erased states of the bits as well as ensure sufficient margin for data retention. That is to say, the erased bits should be in a state in which the current should be above a predetermined current by some margin when the gate voltage Vg is applied as the read voltage during normal read operation and the programmed bits should provide a current below the predetermined current by some margin when the gate voltage Vg is applied as the read voltage for normal read operation.

As shown in FIG. 2, there is also a bit 34 that is not above voltage Vgp arising from the first step in the program operation and thus is not sufficiently programmed for testing based upon applying the normal program verify voltage Vgp as the verify gate voltage Vg. Another program verify is performed with the applied gate voltage of a reduced voltage of Vgr which is lower than program verify voltage Vgp by a predetermined difference which may be 500 millivolts. The relaxed program verify voltage Vgr should be higher than the normal read gate voltage. The relaxed program verify is an easier test than the normal program verify in that bits with a lower threshold voltage can conduct the specified current because of the lowered voltage Vgr being applied as the gate voltage Vg. Using lowered voltage Vgr as the verify gate voltage Vg may be referenced as a relaxed program verify. As shown in FIG. 2, bit 34 passes the relaxed program verify.

Shown in FIG. 3 is for the case where distribution 36 corresponds to the distribution of ECC segments after a program operation starting from an erased distribution 32 that is the same as distribution 32 of FIG. 2, but with the result that there is a bit 38 that not only does not pass the normal program verify based on normal program voltage Vgp but also does not pass the relaxed program verify based on relaxed program voltage Vgr. The difference between FIG. 2 and FIG. 3 then is that the single bit 38 that does not pass the normal program verify in FIG. 3 also does not pass the relaxed program verify. Thus, in this case, the only bit, bit 38, that does not pass the relaxed verify after the first program steps can be expected to require more further programming than will be required to sufficiently program bit 34 in FIG. 2. Therefore, for bit 38 in FIG. 3, it is beneficial to not apply additional program pulses but rather rely on ECC to correct it during normal read operations since otherwise it may slow down the program operation significantly. While for bit 34 in FIG. 2, it is close to passing the normal program verify. Thus in the case of FIG. 2, it is beneficial to apply additional program pulses to see if bit 34 can be moved above the normal program verify level, and only rely on ECC for such bit when the maximum program pulse count has been reached.

Shown in FIG. 4 is a flow diagram 50 that shows how to address the single bit slow-to-program situations of FIGS. 2 and 3. Flow diagram 50 includes steps 52, 54, 56, 58, 60, 62, 64, 66, 68, 70, 72, 74, 78, 80, 82, 84, 86, 88, and 89. At step 52, program operation start which includes initializing the address and the program pulse count. The pulse count would normally be initialized to zero, and the address would be initialized to the first ECC segment to be programmed. In this system a pair of ECC segments can be programmed simultaneously, but the two ECC segments are treated separately in that they each have a set of data bits and corresponding set of ECC bits. Thus the programming for data bits 27 and ECC bits 28 is exemplary for the other ECC segments and thus, in this example, data bits 27 and ECC bits 28 are considered the selected segment. Step 54 is performing a program verify of the current segment at the normal program verify level which is Vgp. At step 56, if the answer is yes, that verification has passed, and the process continues with a determination at step 78 if there is another ECC segment to program. If not at step 78, then the process ends with program done at step 82. If yes at step 78, then the process continues with a step 80 with the programming progressing to the next ECC segment. If the answer is no at step 56 that verification did not pass, a programming pulse is applied and the pulse count is incremented at step 58. In effect when step 78 is the next step, then the programming of that segment is considered successful.

A program verify is then performed at step 60 with the verification occurring at the normal verify level of Vgp. This step identifies the number of failing bits (A) for normal verification. If at step 62, the number of failing bits is zero, which means that current ECC segment has been programmed successfully, the process continues with step 78 and then step 82 if there are no more ECC segments to program and with steps 78 and 80 if there are more ECC segments to program. If there is at least one failed bit from the normal program verify at step 60, the process continues to step 64 to determine, before starting performing the relaxed program verify, if a predetermined number of pulses have been reached. If not, the process continues to step 58 with the application of another program pulse. If the predetermined number of pulses has been reached then the next step is step 66. If step 66 determines that there is just one failed bit, which is A=1 from the normal program verify at step 60, then the next step is step 84 at which the program verify level is relaxed to reduced level Vgr, and a program verify is performed at the relaxed program verify level. If there are more than one failed bits from the normal program verify as determined at step 66, then there is a determination at step 68 if maximum pulse count has been reached. The predetermined pulse count is less than the maximum pulse count. If the maximum pulse count has not been reached then the process continues at step 58 by applying another programming pulse. If the maximum pulse count has been reached then the programming has failed at step 72.

For the case where the process continues with step 84 because of a yes at step 66 in which there is one bit of the current segment that failed the normal verify level Vgp, the verify level is reduced to level Vgr. A determination is made as to whether the bit is still failing at the relaxed verify level Vgr by obtaining the number of failing bits (B) from the relaxed program verify. If it is, then B=1 is true at step 86, which means there is a single bit below both the normal program verify and relaxed program verify. An example of this situation is bit 38 in FIG. 3. The process continues with a determination at step 88 if ECC correction has occurred at on this segment by checking ECC record 16. If not, then the segment is considered as a pass, which is possible because the ECC can be relied upon to correct the single failing bit during normal read operations, and the process continues with step 78 and then either to step 80 or step 82. If the determination at step 88 is that ECC correction has occurred in the current ECC segment, then the next step is a determination at step 89 if the maximum pulse count has been reached. If not, the process continues by applying another programming pulse at step 58. This is the case because the ECC circuits have already been used to correct another single-bit issue so that ECC can no longer be relied upon to correct the single slow-to-program failing bit on the current ECC segment. Thus it is necessary to keep applying program pulses to move the single failing bit above the normal program verify level. If at step 86 B=0, then the process also continues at step 89 with a determination if the maximum pulse count has occurred. If not, then another programming pulse is applied at step 58. In the case of the maximum pulse having been reached at step 89, then if A=1 at step 62 and B=0 at step 86, which means there is a single bit below the normal program verify but above the relaxed program verify, e.g. bit 34 in FIG. 2, then a further determination is made at step 74 if ECC correction has occurred on the current segment. If so then, at step at 72 the programming has failed. If the ECC correction has not occurred on the current ECC segment, then that segment is a pass and the then step 78 followed by either step 80 or 82.

Taking advantage of available ECC correction capability can be at block level instead of at segment level although for an actual correction it is at the segment level. For example, there may be cases where the total number of ECC corrections occurred in a block can be important. Thus, instead of simply determining that no ECC correction has been done, it may also be beneficial to determine the total number of ECC corrections made on an entire block Thus, a memory block has been through a program operation that takes advantage of knowing the most likely situation of a single failed bit and taking advantage of the available ECC. This is especially true at the segment level. For example, a segment may have 64 bits of data with 8 bits of corresponding ECC. If the ECC is not to be otherwise required and there is a single slow bit during program, then the ECC can be relied upon to handle the situation. If the single slow bit is close to passing, then programming may continue with the expectation that it will ultimately pass. If the single slow bit is far from passing, then there is not likely to be a success in continuing the program process so the subsequent program steps need not be performed if the ECC can be relied upon with a very high degree of confidence to correct the error.

Another approach is to not perform the ECC check during program verify, but consider the program operation successful if only one bit fails at normal program verify level and only one bit fails at the relaxed program verify level, or only one bit fails at normal program verify level but the number of program pulse count reaches the maximum program pulse count limit. ECC would still be performed during normal read operation to correct the failed bit. Correction may be possible for any programming operation for any segment in which there is only one bit that fails to program and that the ECC bits for that segment are not otherwise needed.

By now it should be appreciated that there has been provided a semiconductor memory storage device that includes an array of non-volatile memory (NVM) bit cells, wherein the array of NVM bit cells is partitioned in one or more blocks. The Semiconductor memory storage device further includes a memory controller coupled to the array of NVM bit cells. The Semiconductor memory storage device further includes an error correction code (ECC) unit coupled to the array and the memory controller. The memory controller is configured to, during a program operation of a subset of one of the blocks, consider the program operation to be successful when a first program verify operation detects only one of the NVM bit cells fails to program verify at a normal program verify voltage level and when a second program verify operation detects the one of the NVM bit cells fails to program verify at a relaxed program verify voltage level, wherein the relaxed program verify voltage level is less than the normal program verify voltage level and higher than a normal read voltage level. The semiconductor memory storage device may have a further characterization by which the program operation is considered to be successful if the ECC unit did not previously perform a correction on the subset that is being programmed. The semiconductor memory storage device may have a further characterization by which wherein during the program operation which comprises program pulses, the first and second program verify operations are performed after each program pulse or group of program pulses. The semiconductor memory storage device may have a further characterization by which a predetermined number of program pulses are performed by the memory controller before counting a number of NVM bit cells that failed the first program verify operation. The semiconductor memory storage device may have a further characterization by which the predetermined number of program pulses is between 2 and 10 program pulses. The semiconductor memory storage device may have a further characterization by which the second program verify operation is performed when the first program verify operation detects only one of the NVM cells fails to program verify at the normal program verify voltage level. The semiconductor memory storage device may have a further characterization by which the program operation is considered successful if the ECC unit did not previously perform a correction on the one of the blocks that includes the one of the NVM bit cells that failed to program verify at the relaxed program verify voltage level. The semiconductor memory storage device may have a further characterization by which the memory controller is configured to, during the program operation on the one of the blocks when the first program verify operation detects only one of the NVM bit cells fails to program verify at the normal program verify voltage level and the second program verify operation detects all of the NVM bit cells successfully programmed at the relaxed program verify voltage level, consider the program operation to be successful if a maximum number of program pulses is reached. The semiconductor memory storage device may have a further characterization by which the program operation is considered to be successful by the memory controller if the ECC unit did not previously perform a correction on the subset that includes the one of the NVM bit cells that failed to program verify at the normal program verify voltage level. The semiconductor memory storage device may have a further characterization by which wherein the program operation is considered to not be successful if the ECC unit previously performed a correction on the one of the blocks that includes the one of the NVM bit cells that failed to program verify at the normal program verify voltage level. The semiconductor memory storage device may further include an ECC record containing one or more ECC indicators stored in non-volatile memory, wherein one of the ECC indicators is allocated to the subset and indicates whether an ECC correction has been performed on the subset.

Also disclosed is a method of programming a semiconductor memory device. The method further includes performing a program operation on a subset of an array of non-volatile bit cells and designating the program operation as successful when a maximum number of program pulses is reached if during the program operation a first program verify operation detects only one of the non-volatile bit cells fails to program verify at a normal program verify voltage level and a second program verify operation detects all of the non-volatile bit cells successfully programmed at a relaxed program verify voltage level, wherein the relaxed program verify voltage level is lower than the normal program verify voltage level. The method may further include designating the program operation as successful during the program operation when the first program verify operation detects that only one of the non-volatile bit cells fails to program verify at the normal program verify voltage level and when the second program verify operation detects that one of the non-volatile bit cells fails to program verify at the relaxed program verify voltage level. The method may further include designating the program operation as successful if an Error Correction Code (ECC) correction was not previously performed on the subset of non-volatile bit cells that is being programmed. The method may have a further characterization by which the program operation is considered successful if the ECC unit did not previously perform a correction on the subset that includes the one of the non-volatile bit cells that failed to program verify at the relaxed program verify voltage level, during the program operation, the first and second verify operations are performed after each program pulse or group of program pulses. The method may have a further characterization by which. The method may further include designating the program operation as successful if an Error Correction Code (ECC) correction was not previously performed on the subset of the non-volatile bit cells that includes the bit cell that failed to program verify at the normal program verify voltage level and the relaxed program verify voltage level. The method may further include designating the program operation as successful if an Error Correction Code (ECC) unit did not previously perform a correction on the subset that includes the one of the non-volatile bit cells that failed to program verify at the relaxed program verify voltage level and the relaxed program verify voltage level.

Disclosed also is a method of programming a non-volatile semiconductor memory device. The method includes determining a number of bit cells that failed to program verify during a program operation, wherein the bit cells are included in a subset of bit cells in an array of bit cells. The method further includes determining whether an Error Correction Code (ECC) correction has been previously performed for the subset of bit cells. The method further includes allowing the program operation to be considered successful if the number of bit cells that failed to program verify after a predetermined number of program pulses is below a threshold number and the ECC correction has not been performed for the subset of bit cells. The method may further include, during the program operation on the subset of the bit cells, when the first program verify operation detects a predetermined number of the bit cells fails to program verify at the normal program verify voltage level and when the second program verify operation detects another predetermined number of the bit cells fails to program verify at the relaxed program verify voltage level, designating the program operation as successful.

Although the invention is described herein with reference to specific embodiments, various modifications and changes can be made without departing from the scope of the present invention as set forth in the claims below. For example, the number of segments simultaneously programmed may vary. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor memory storage device, comprising:
   an array of non-volatile memory (NVM) bit cells, wherein the array of NVM bit cells is partitioned in one or more blocks;
   a memory controller coupled to the array of NVM bit cells; and
   an error correction code (ECC) unit coupled to the array and the memory controller, wherein the memory controller is configured to:
      during a program operation of a subset of one of the blocks, consider the program operation to be successful
         when a first program verify operation detects only one of the NVM bit cells fails to program verify at a normal program verify voltage level, and
         when a second program verify operation detects the one of the NVM bit cells fails to program verify at a relaxed program verify voltage level, wherein the relaxed program verify voltage level is less than the normal program verify voltage level and higher than a normal read voltage level.

2. The semiconductor memory storage device of claim 1, wherein the program operation is considered to be successful if the ECC unit did not previously perform a correction on the subset that is being programmed.

3. The semiconductor memory storage device of claim 1, wherein during the program operation which comprises program pulses, the first and second program verify operations are performed after each program pulse or group of program pulses.

4. The semiconductor memory storage device of claim 1, wherein a predetermined number of program pulses are performed by the memory controller before counting a number of NVM bit cells that failed the first program verify operation.

5. The semiconductor memory storage device of claim 4, wherein the predetermined number of program pulses is between 2 and 10 program pulses.

6. The semiconductor memory storage device of claim 1, wherein the second program verify operation is performed when the first program verify operation detects only one of the NVM cells fails to program verify at the normal program verify voltage level.

7. The semiconductor memory storage device of claim 1, wherein the program operation is considered successful if the ECC unit did not previously perform a correction on the one of the blocks that includes the one of the NVM bit cells that failed to program verify at the relaxed program verify voltage level.

8. The semiconductor memory storage device of claim 1, wherein the memory controller is configured to, during the program operation on the one of the blocks when the first program verify operation detects only one of the NVM bit cells fails to program verify at the normal program verify voltage level and the second program verify operation detects all of the NVM bit cells successfully programmed at the relaxed program verify voltage level, consider the program operation to be successful if a maximum number of program pulses is reached.

9. The semiconductor memory storage device of claim 8, wherein the program operation is considered to be successful by the memory controller if the ECC unit did not previously perform a correction on the subset that includes the one of the NVM bit cells that failed to program verify at the normal program verify voltage level.

10. The semiconductor memory storage device of claim 8, wherein the program operation is considered to not be successful if the ECC unit previously performed a correction on the one of the blocks that includes the one of the NVM bit cells that failed to program verify at the normal program verify voltage level.

11. The semiconductor memory storage device of claim 1, further comprising an ECC record containing one or more ECC indicators stored in non-volatile memory, wherein one of the ECC indicators is allocated to the subset and indicates whether an ECC correction has been performed on the subset.

12. A method of programming a semiconductor memory device comprising:
    performing a program operation on a subset of an array of non-volatile bit cells, and
    designating the program operation as successful when a maximum number of program pulses is reached if during the program operation a first program verify operation detects only one of the non-volatile bit cells fails to program verify at a normal program verify voltage level and a second program verify operation detects all of the non-volatile bit cells successfully programmed at a relaxed program verify voltage level, wherein the relaxed program verify voltage level is lower than the normal program verify voltage level.

13. The method of claim 12 further comprising:
    designating the program operation as successful during the program operation
        when the first program verify operation detects that only one of the non-volatile bit cells fails to program verify at the normal program verify voltage level, and
        when the second program verify operation detects that one of the non-volatile bit cells fails to program verify at the relaxed program verify voltage level.

14. The method of claim 13, wherein during the program operation, the first and second verify operations are performed after each program pulse or group of program pulses.

15. The method of claim 13, further comprising designating the program operation as successful if an Error Correction Code (ECC) correction was not previously performed on the subset of the non-volatile bit cells that includes the bit cell that failed to program verify at the normal program verify voltage level and the relaxed program verify voltage level.

16. The method of claim 13, further comprising designating the program operation as successful if an Error Correction Code (ECC) unit did not previously perform a correction on the subset that includes the one of the non-volatile bit cells that failed to program verify at the relaxed program verify voltage level and the relaxed program verify voltage level.

17. The method of claim 12, further comprising designating the program operation as successful if an Error Correction Code (ECC) correction was not previously performed on the subset of non-volatile bit cells that is being programmed.

18. The method of claim 12, wherein the program operation is considered successful if the ECC unit did not previously perform a correction on the subset that includes the one of the non-volatile bit cells that failed to program verify at the relaxed program verify voltage level.

19. A method of programming a non-volatile semiconductor memory device comprising:
    determining a number of bit cells that failed to program verify during a program operation, wherein the bit cells are included in a subset of bit cells in an array of bit cells;
    determining whether an Error Correction Code (ECC) correction has been previously performed for the subset of bit cells; and
    allowing the program operation to be considered successful if the number of bit cells that failed to program verify after a predetermined number of program pulses is below a threshold number and the ECC correction has not been performed for the subset of bit cells.

20. The method of claim 19, further comprising:
    during an erase operation on a subset of bit cells,
        when a first verify operation detects a predetermined number of the subset of bit cells fails to erase verify at a normal erase verify voltage level; and
        when a second verify operation detects the predetermined number of the subset of bit cells fails to erase verify at a relaxed erase verify voltage level,
    designating the erase operation as successful.

\* \* \* \* \*